US006812729B2

(12) United States Patent
Chen et al.

(10) Patent No.: US 6,812,729 B2
(45) Date of Patent: Nov. 2, 2004

(54) SYSTEM AND METHOD FOR CHARACTERIZING THE QUALITY OF THE INTERFACE BETWEEN A SILICON AND A GATE INSULATOR IN A MOS DEVICE

(75) Inventors: Miin-Jang Chen, Taipei (TW); Ching-Fuh Lin, Taipei (TW); Chee-Wee Liu, Taipei (TW); Min-Hung Lee, Taipei (TW); Shu-Tong Chang, Hsin-Chu (TW)

(73) Assignee: National Taiwan University (TW)

( * ) Notice: Subject to any disclaimer, the term of this patent is extended or adjusted under 35 U.S.C. 154(b) by 0 days.

(21) Appl. No.: 10/175,720

(22) Filed: Jun. 19, 2002

(65) Prior Publication Data

US 2003/0116793 A1 Jun. 26, 2003

(30) Foreign Application Priority Data

Dec. 21, 2001 (TW) ........................................ 90131949 A

(51) Int. Cl.[7] ............................................... G01R 31/26
(52) U.S. Cl. ........................ 324/766; 324/752; 324/765
(58) Field of Search ................................ 324/750–752, 324/765–767, 501; 356/409; 250/344, 310–311, 492.21

(56) References Cited

U.S. PATENT DOCUMENTS

| 4,661,770 | A | * | 4/1987 | von Roos | 324/767 |
| 5,012,100 | A | * | 4/1991 | Plies et al. | 250/342 |
| 5,124,553 | A | * | 6/1992 | Hilliard et al. | 250/344 |
| 5,270,655 | A | * | 12/1993 | Tomita | 324/767 |
| 5,506,685 | A | * | 4/1996 | Grasdepot | 356/409 |
| 5,598,100 | A | * | 1/1997 | Maeda et al. | 324/501 |

* cited by examiner

*Primary Examiner*—Vinh P. Nguyen
(74) *Attorney, Agent, or Firm*—Martine & Penilla, LLP

(57) ABSTRACT

A method for characterizing the quality of the interface between a silicon and a gate insulator in a MOS device includes the steps of: applying at least one current to the MOS device through the gate; detecting at least one electroluminescent signal corresponding to the silicon bandgap energy after the current flows through the MOS device; and outputting the electroluminescent waveform in the time domain. The quality of the interface between a silicon and a gate insulator in the MOS device is determined by analyzing the minority carrier lifetime in silicon. The invention also discloses a characterization system for implementing the method.

2 Claims, 5 Drawing Sheets

SYSTEM AND METHOD FOR CHARACTERIZING THE QUALITY OF THE INTERFACE BETWEEN A SILICON AND A GATE INSULATOR IN A MOS DEVICE

BACKGROUND OF THE INVENTION

1. Field of the Invention

The invention relates to a system and method for characterizing the quality of a semiconductor device and, more particularly, to a system and method for characterizing the quality of the interface between a silicon and a gate insulator in a MOS device.

2. Description of the Related Art

Metal-oxide-semiconductor transistors (hereinafter referred to as MOS devices) are the most widely used and most important transistors in the Ultra-Large-Scale-Integrated (ULSI) circuits using the silicon semiconductor crystal. Various kinds of integrated circuits (ICs) such as microprocessors used in personal computers are usually constituted by up to several millions of MOS devices. Therefore, the properties of the MOS devices have to be well controlled so as to obtain an integrated circuit with good performance. For example, it is well known that the lattice defects, impurities, interface state densities ($D_{it}$) and minority carrier lifetime near the gate insulator/silicon interface, are closely related to the quality of the gate insulator and the performance of a MOS device. As a result, it is very important to exactly measure the defects, impurities, interface state densities ($D_{it}$) and minority carrier lifetime near the gate insulator/silicon interface in MOS devices.

Conventional methods such as the high/low frequency capacitance-voltage analysis, conductance method, charge-pumping method, and transient capacitance-time Zerbst analysis, etc., have been successfully used to measure the interface state densities and minority carrier lifetime of MOS devices with relatively thick gate insulator. However, when the line width has been reduced to 0.13 to 0.09 microns in the advanced ULSI technology, the thickness of the gate insulator in a MOS device is in the range of 15 to 30 angstroms, which is about the thickness of 3 to 6 layers of atoms. The ultra-thin gate insulator with such small thickness may result in significant leakage current tunneling through the gate insulator, thereby increasing series resistance of MOS capacitors. The significant series resistance in MOS devices due to the ultra-thin gate insulator complicates the analysis and causes the modeling based on the above measurement technologies to be difficult. As a result, it is necessary to develop a novel and simpler method for measuring the defects, impurities, interface state densities, and minority carrier lifetime near the gate insulator/silicon interface in the MOS devices with ultra-thin gate insulator

SUMMARY OF THE INVENTION

To solve the above-mentioned problems, the invention provides a characterization system and method utilizing the characteristics of great gate tunneling currents in the MOS device with ultra-thin gate insulator. The minority carrier lifetime near the gate insulator/silicon interface in the MOS device is obtained by measuring the temporal electroluminescenct signal corresponding to the silicon bandgap energy. The characterization system and method can be used to investigate the parameters related to the quality of the gate insulator/silicon interface, such as lattice defects, impurities, interface state densities.

To achieve the above-mentioned object, a method to characterize the gate insulator/silicon interface quality in the MOS device with ultra-thin gate insulator includes the steps of applying a current to the MOS device through the gate; detecting at least one electroluminescent signal corresponding to the silicon bandgap energy after the current flows through the MOS device; and outputting the electroluminescent waveform in the time domain. The minority carrier lifetime can be extracted from the temporal electroluminescent waveform. The quality of the gate insulator/silicon interface in the MOS device is determined by analyzing the minority carrier lifetime in silicon.

To implement the above-mentioned method, a characterization system may include a current source, a photodetector and an output sub-system. The output sub-system may include a gate integrator and boxcar averager, a gate scanner and an X-Y recorder. The current source applies at least one current to the MOS device. The photodetector detects at least one electroluminescent signal corresponding to the silicon bandgap energy after the current flows through the MOS device. The gate integrator and boxcar averager receives the electroluminescent signals, integrates the signals during the gated period, and averages the received electroluminescent signals over many shots of the injection current. The gate scanner controls the position of the gate in the gate integrator and boxcar averager in the time domain, so that the gate can scan in the time domain to allow the retrieval of entire temporal electroluminescent waveform. The X-Y recorder records the voltage signals output from the gate scanner as the time axis, and records the voltage signals output from the gate integrator and boxcar averager as the intensity of the electroluminescent signals, to obtain the electroluminescent waveform in the time domain. According to the measured temporal electroluminescent waveform, the minority carrier lifetime near the gate insulator/silicon interface can be obtained.

The current supplied from the current source may be a square wave or a pulse. The electroluminescent signal from the photodetector may be amplified by an amplifier. The photodetector may be an InGaAs or a germanium photodetector. The bandwidths of the current source, photodetector, amplifier and gate integrator and boxcar averager have to be greater than 10 MHz.

The output sub-system also may be a combination of an amplifier and an oscilloscope. Under the condition that the amplification of the amplifier is great enough and the bandwidths of the amplifier and oscilloscope are large enough (>10 MHz), the oscilloscope may directly display the temporal electroluminescent waveform.

DETAILED DESCRIPTION OF THE INVENTION

The system and method to characterize the gate insulator/silicon interface in a MOS device in accordance with a preferred embodiment of the invention will be described with reference to the accompanying drawings, wherein the same reference numbers denote the same elements.

Figure 1:
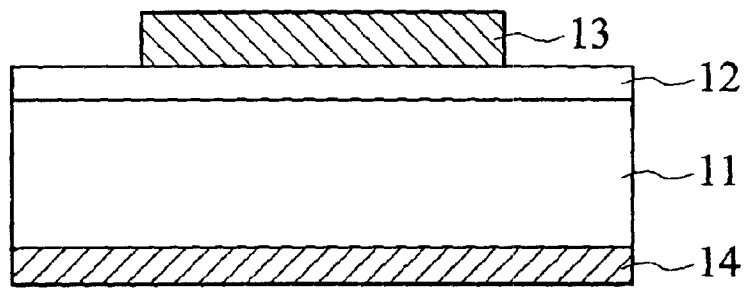
FIG. 1 is a schematic illustration showing the structure of a MOS device.

FIG. 1 shows the structure of a MOS device 10. An ultra-thin gate insulator 12 is grown on the surface of a silicon substrate 11, and a gate 13 of the MOS device is deposited on the gate insulator 12. The gate 13 may be metal or polysilicon. Finally, a metal layer 14 is deposited on the backside of the silicon substrate 11 as another electrode of the MOS device.

Figure 2:
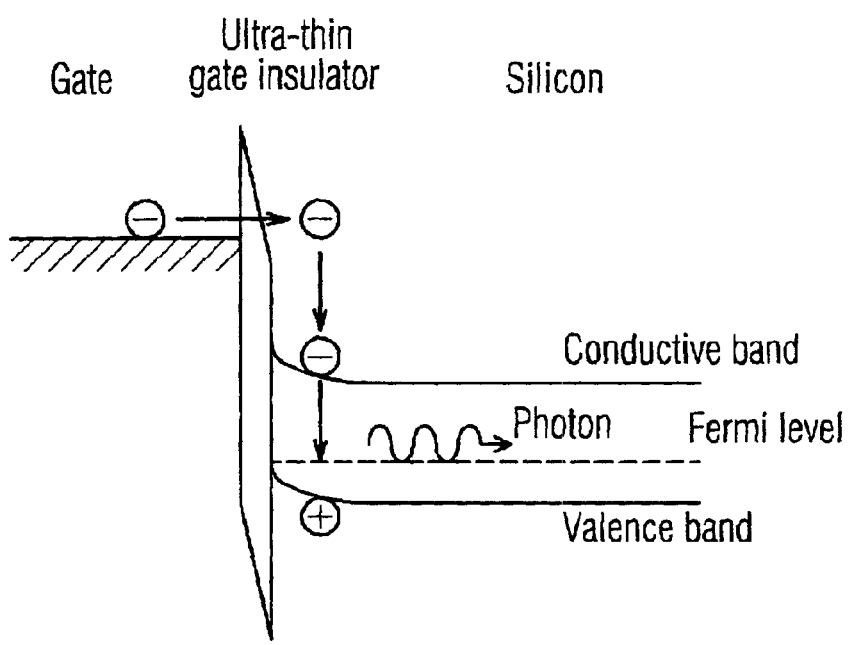
FIG. 2 is a schematic illustration showing a band diagram of the MOS device when the electroluminescence takes place.

FIG. 2 shows the band diagram of the MOS device when electroluminescence takes places. When the MOS device is operated in the accumulation region, a large number of majority carriers are accumulated near the gate insulator/silicon interface. The gate insulator is thin enough to allow significant tunneling current taking place. The carriers tunneling from the gate radiatively recombine with the majority carriers near the gate insulator/silicon interface. Thus, infrared radiation corresponding to silicon bandgap energy is generated.

Figure 3:
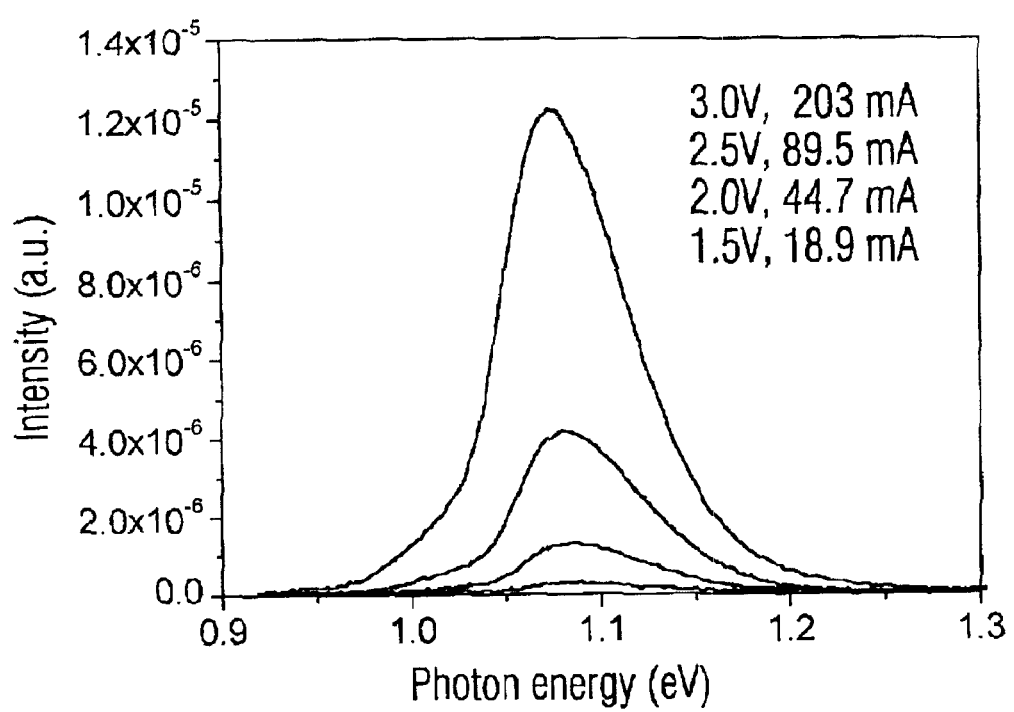
FIG. 3 is a graph showing the electroluminescent spectra from the MOS device.

FIG. 3 shows the electroluminescent spectra of the MOS device at room temperature. The photon energy at the peaks of the spectra is around 1.09 eV, which is slightly below the bandgap energy of silicon crystal at room temperature. This is due to the participation of optical phonon for the requirement of momentum conservation in the radiative recombination.

Figure 4A:
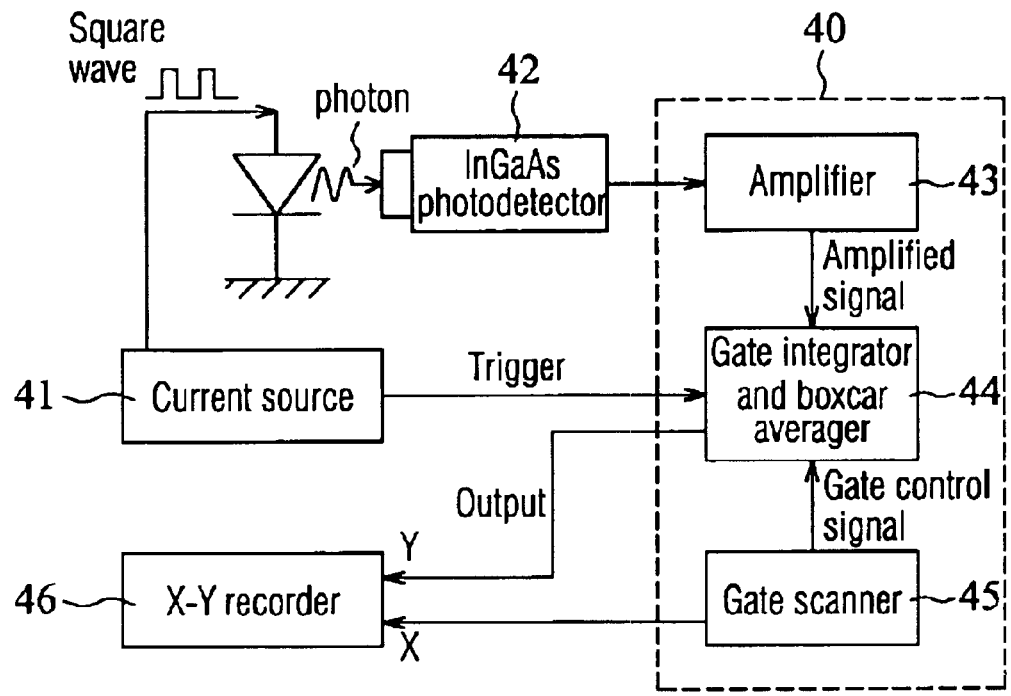
FIG. 4A is a block diagram showing a system for measuring the temporal electroluminescent signals from a MOS device in accordance with the preferred embodiment of the invention.

FIG. 4A shows a system for measuring the electroluminescent signal in the time domain from the MOS device in accordance with the preferred embodiment of the invention. The electrodes of a current source 41 are connected to the gate 13 of the MOS device 10 and the electrode 14 on the back of the silicon substrate 11, respectively. A square current is injected into the MOS device 10 via the gate 13 and the backside electrode 14 so as to generate the electroluminescence. Then, an InGaAs photodetector 42 is closely placed to the gate 13 of the MOS device to collect the infrared radiation.

The signal from the InGaAs photodetector 42 is sent to an output sub-system 40 to show the electroluminescent waveform in the time domain. In this embodiment, since the electroluminescent signal from the InGaAs photodetector 42 is weak, an amplifier 43 is used to amplify the electroluminescent signal. The amplified signal from the amplifier 43 is further fed to a scanning-gate integrator and boxcar averager system.

After electroluminescent signals are sent to a gate integrator and boxcar averager 44, the intensities of the electroluminescent signals within the sampling interval are integrated and averaged. The gate integrator and boxcar averager 44 is triggered by the current source 41 and averages the electroluminescent signals over many shots of the injection current so as to reduce the noise. The sampling interval of the electroluminescent signals is determined by the width of the gate, while position of the gate in the time domain is controlled by a gate scanner 45. The gate scanner 45 outputs a voltage signal to the gate integrator and boxcar averager 44 so as to control the position of the gate in the time domain. Accordingly, the gate scans in the time domain to measure the intensities of the electroluminescent signals in the time domain continuously. Finally, the gate scanner 45 outputs voltage signals to an X-Y recorder 46 as horizontal axis (X-axis), which represents the time axis for the electroluminescent signals. On the other hand, the gate integrator and boxcar averager 44 outputs voltage signals to the X-Y recorder 46 as vertical axis (Y-axis), which represents intensities of the electroluminescence signals. As a result, the electroluminescent signals in the time domain of the MOS device 10 are acquired.

Figure 4B:
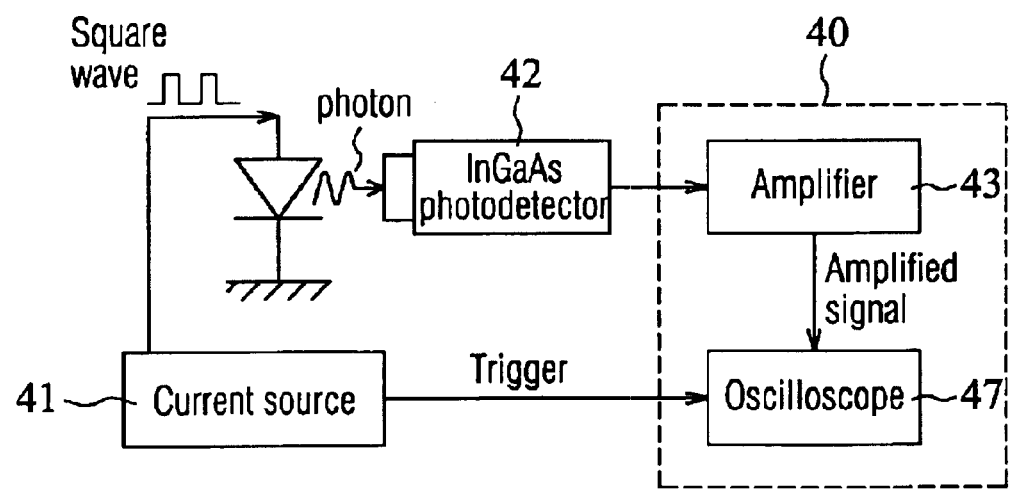
FIG. 4B is a block diagram showing another system for measuring the temporal electroluminescent signals from a MOS device in accordance with the preferred embodiment of the invention.

In this embodiment, it should be noted that the bandwidth of each unit (the current source 41, the InGaAs photodetector 42, the amplifier 43 and the gate integrator and boxcar averager 44) of the measuring system has to be greater than 10 MHz. Thus, the measuring system can possess enough resolution in the time domain to measure the minority carrier lifetime in silicon. In addition, one of ordinary skill in the art may also record or observe the temporal electroluminescent signal by another method. For example, as shown in FIG. 4B, the oscilloscope 47 with bandwidth greater than 10 MHz can be used to directly show the electroluminescent waveform in the time domain.

Figure 5A:
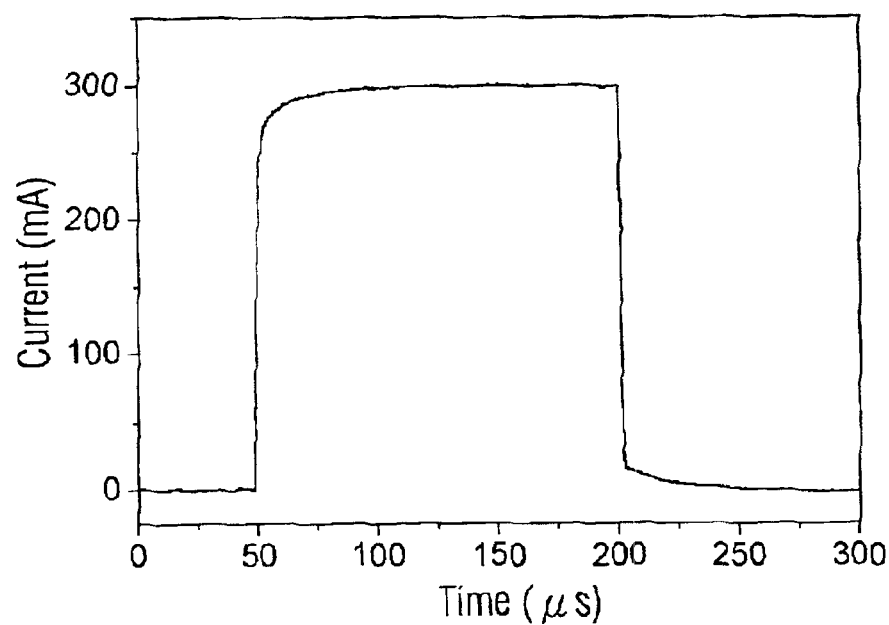
FIG. 5A is a graph showing a waveform of a square current with duration of 150 microseconds.
Figure 5B:
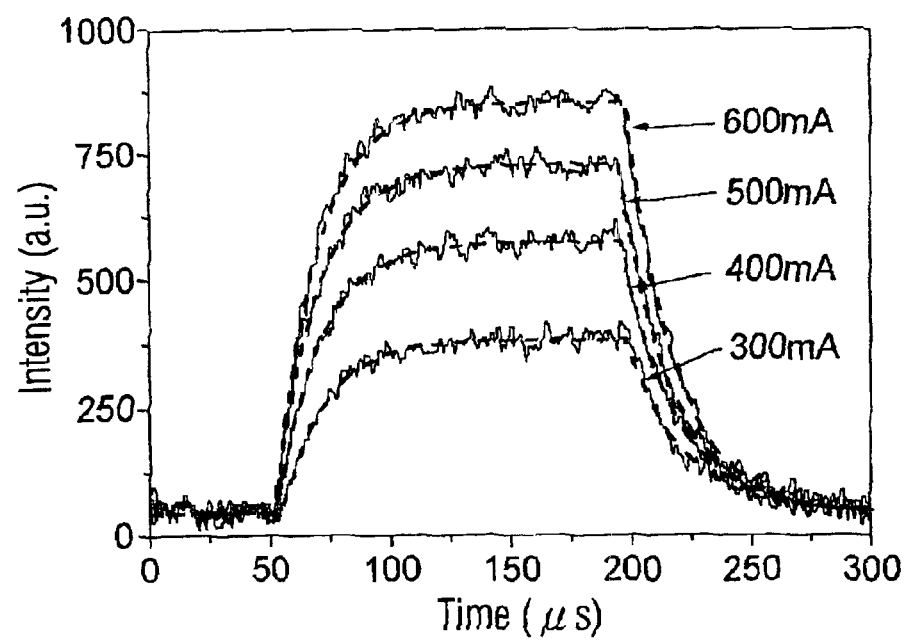
FIG. 5B is a graph showing the electroluminescent waveforms in the time domain from the MOS device at various injection currents.

The waveforms of the electroluminescent signals generated from the MOS device under the injection of a square current are shown in FIGS. 5A and 5B. FIG. 5A shows a square current waveform with duration of 150 microseconds, while FIG. 5B shows the temporal waveforms of the electroluminescence from the MOS device at various injection currents. Compared to the waveform of the square current in FIG. 5A, the rising and falling edges of the electroluminescent waveforms shown in FIG. 5B vary relatively slowly. Thus, the measured electroluminescent waveform can tracks the variation of the excess minority carrier density with time. Therefore, the rising or falling time of the electroluminescent waveform represents the minority carrier lifetime. By measuring the rising or falling time of the electroluminescence waveform, we can determine the minority carrier lifetime near the gate insulator/silicon interface.

The variation of excess minority carrier density with time can be expressed using the following equation:

$$\frac{dP}{dt} = G - (A \cdot P + B \cdot NP + C \cdot N^2 P) \quad (1)$$

where "P" represents the excess minority carrier density, "N" represents the majority carrier density, "G" represents the generation rate of the excess minority carrier density due to the injection current, and "t" represents time. "A" is the coefficient of the Shockley-Read-Hall (SRH) recombination through the nonradiative recombination states near the gate insulator/silicon interface., while "B" and "C" represent the radiative recombination coefficient and the Auger recombination coefficient, respectively. By solving Equation (1), we obtain the following expression to fit the rising and falling edges of the electroluminescent waveforms:

$$L(t) = L(t) - [L(\infty) - L(0)] \cdot \exp\left(-\frac{t}{\tau}\right) \quad (1.5)$$

where $L(\infty)$ and $L(0)$ denote the final and initial values of the light intensities, respectively, and $\tau$ is the minority carrier lifetime. The minority carrier lifetime $\tau$ is related to the carrier recombination coefficients A, B and C:

$$\frac{1}{\tau} = A + B \cdot N + C \cdot N^2 \quad (2)$$

where $1/\tau$ represents the recombination rate of carriers. The dotted lines in FIG. 5B are obtained by fitting the experimental data using Equation (1.5), which show a good match between the theoretical calculation and the experimental data.

Figure 6:
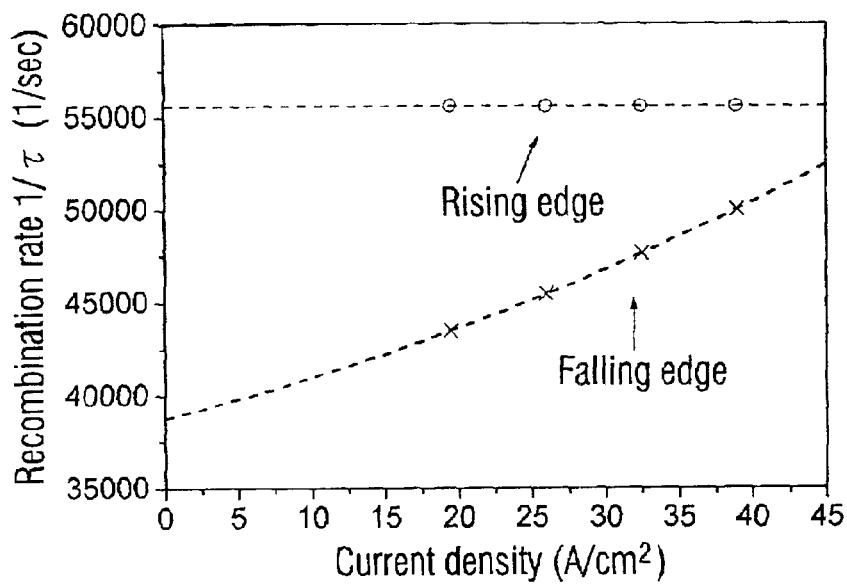
FIG. 6 is a graph showing that the carrier recombination rates 1/τ versus the injected current level at the rising and falling edges of the electroluminescent signals in FIG. 5B; in which the dashed lines are the theoretical fitting.

The carrier recombination rates $1/\tau$ corresponding to the rising and falling edges of the electroluminescent waveforms under various injection current densities in FIG. 5B are shown in FIG. 6. At the rising edge of electroluminescent waveform, the recombination rate is independent of the injection current density. Because the majority carrier density N near the gate insulator/silicon interface increases with the injection current, it can be understood from Equation (2) that the SRH nonradiative recombination represented by the coefficient A is the dominant carrier recombination mechanism at the rising edge of the electroluminescent signal. On the other hand, the carrier recombination rate increases with the injection current density at the falling edge of the electroluminescent waveform. It also can be understood from Equation (2) that the carrier radiative recombination and Auger recombination represented by the coefficients B and C cannot be neglected at the falling edge.

As can be known from the above description, the minority carrier lifetime extracted from the rising edge of the temporal electroluminescent waveform is mainly determined by the SRH nonradiative recombination close to the gate insulator/silicon interface in the MOS device. Thus, the effect of radiative recombination and Auger recombination can be ignored. The rising edge of the electroluminescent waveform in the time domain can be used to characterize the SRH nonradiative recombination near the gate insulator/silicon interface. The minority carrier lifetime will be small if the density of the SRH nonradiative recombination states is great. The lattice defects, impurities and interface states densities near the gate insulator/silicon interface, are the sources of the SRH nonradiative recombination states. By measuring the minority carrier lifetimes corresponding to the rising edges of the temporal electroluminescent waveforms, one can compare the quality of the gate insulator/silicon interface for the ultra-thin gate insulators grown under different conditions.

Figure 7:
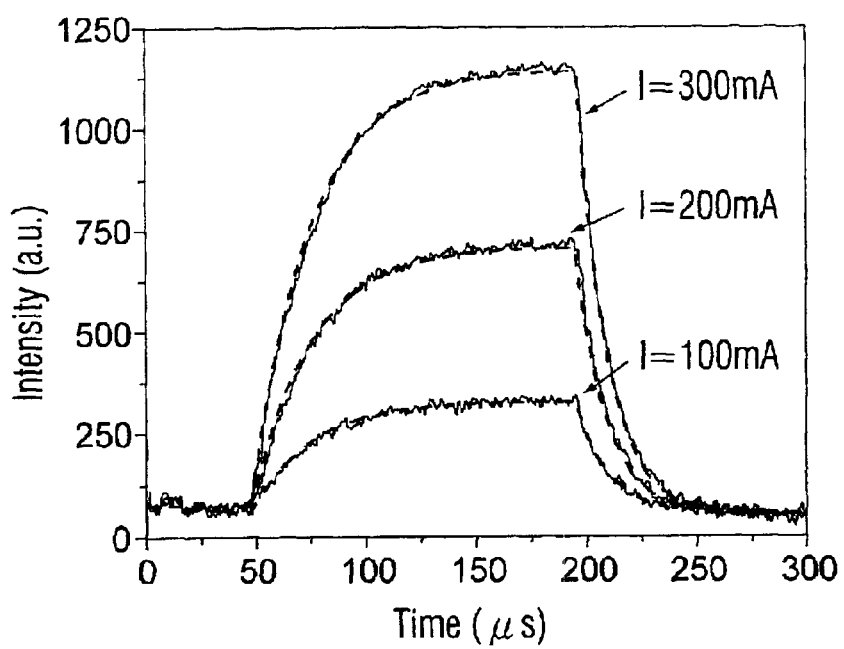
FIG. 7 is a graph showing the electroluminescent waveforms in the time domain from another MOS device at various injection currents.

FIG. 7 shows the temporal electroluminescent waveform of another MOS device under the injection of a square current of 150 microseconds. The ultra-thin gate insulator of the MOS devices in FIGS. 5B and 7 are grown under different conditions. By solving Equation (1) to fit the rising edges of the temporal electroluminescent waveforms, we can obtain that the minority carrier lifetimes are 18 and 27 microseconds corresponding to FIGS. 5B and 7, respectively. Consequently, in comparison with the MOS device of FIG. 5B, the crystal lattice defects, impurities and interface state densities near the gate insulator/silicon interface in the MOS device of FIG. 7 are smaller. Therefore, the characterization of temporal electroluminescent signals from MOS devices can be an effective method to investigate the minority carrier lifetime near the gate insulator/silicon interface of MOS devices with ultra-thin gate insulator.

While the invention has been described by way of an example and in terms of a preferred embodiment, it is to be understood that the invention is not limited to the disclosed embodiment. To the contrary, it is intended to cover various modifications. For instance, the filter may be a high-pass filter or a low-pass filter. Therefore, the scope of the appended claims should be accorded the broadest interpretation so as to encompass all such modifications.

What is claimed is:

1. A method for characterizing the quality of the interface between a silicon and a gate insulator in a MOS device, comprising:

applying at least one current to the MOS device;

detecting at least one electroluminescent signal corresponding to the silicon bandgap energy after the current flows through the MOS device;

outputting a temporal electroluminescent waveform in the time domain; and determining the quality of the gate insulator/silicon interface in the MOS device by analyzing the minority carrier lifetime in silicon based on the temporal electroluminescent waveform in the time domain, wherein the outputting step comprises:

receiving the electroluminescent signals by using a gate integrator and boxcar averager, integrating the signals during the gated period in the gate integrator and boxcar averager, and averaging the received electroluminescent signals;

controlling a position of a gate in the gate integrator and boxcar averager in the time domain by using a gate scanner, so that the gate can scan in the time domain to allow the retrieval of entire temporal electroluminescent waveform; and using an X-Y recorder to record voltage signals output from the gate scanner as the time axis, and to record voltage signals output from the gate integrator and boxcar averager as the intensity of the electroluminescent signals, to obtain the electroluminescent waveform in the time domain; according to the measured temporal electroluminescent waveform, the minority carrier lifetime near the gate insulator/silicon interface can be obtained.

2. A system for characterizing the quality of the interface between a silicon and a gate insulator in a MOS device, comprising:

a current source for applying at least one current to the MOS device;

a photodetector for detecting at least one electroluminescent signal corresponding to the silicon bandgap energy after the current flows through the MOS device;

an output sub-system for outputting a temporal electroluminescent waveform in the time domain; and means for determining the quality of the gate insulator/silicon interface in the MOS device by analyzing the minority carrier lifetime in silicon based on the temporal electroluminescent waveform in the time domain, wherein the output sub-system comprises:

a gate integrator and boxcar averager for receiving electroluminescent signals, integrating the electroluminescent signals during the gated period in the gate integrator and boxcar averager, and averaging the received electroluminescence signals; a gate scanner for controlling a position of a gate in the gate integrator and boxcar averager in the time domain, so that the gate can scan in the time domain to allow the retrieval of entire temporal electroluminescent waveform; and an X-Y recorder for recording the voltage signals output from the gate scanner as the time axis, and recording the voltage signals output from the gate integrator and boxcar averager as the intensity of the electroluminescent signals, to obtain the electroluminescent waveform in the time domain; according to the measured temporal electroluminescent waveform, minority carrier lifetime near the gate insulator/silicon interface can be obtained.

* * * * *